(12) United States Patent
Yang et al.

(10) Patent No.: US 9,070,576 B2
(45) Date of Patent: Jun. 30, 2015

(54) SEMICONDUCTOR DEVICE AND RELATED FABRICATION METHODS

(75) Inventors: Hongning Yang, Chandler, AZ (US); Zhihong Zhang, Chandler, AZ (US); Jiang-Kai Zuo, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 94 days.

(21) Appl. No.: 13/606,797

(22) Filed: Sep. 7, 2012

(65) Prior Publication Data

US 2014/0070311 A1 Mar. 13, 2014

(51) Int. Cl.
| | |
|---|---|
| H01L 29/66 | (2006.01) |
| H01L 29/08 | (2006.01) |
| H01L 29/78 | (2006.01) |
| H01L 29/45 | (2006.01) |
| H01L 29/49 | (2006.01) |
| H01L 29/06 | (2006.01) |
| H01L 29/10 | (2006.01) |

(52) U.S. Cl.
CPC ........... *H01L 29/0878* (2013.01); *H01L 29/456* (2013.01); *H01L 29/4933* (2013.01); *H01L 29/665* (2013.01); *H01L 29/66689* (2013.01); *H01L 29/7824* (2013.01); *H01L 29/0653* (2013.01); *H01L 29/1087* (2013.01); *H01L 29/1095* (2013.01)

(58) Field of Classification Search
None
See application file for complete search history.

(56) References Cited

U.S. PATENT DOCUMENTS

| | | | |
|---|---|---|---|
| 5,569,949 | A | 10/1996 | Malhi |
| 6,352,901 | B1 * | 3/2002 | Chang ........................... 438/309 |
| 6,365,932 | B1 | 4/2002 | Kouno et al. |
| 8,193,585 | B2 | 6/2012 | Grote et al. |
| 2003/0085414 | A1 | 5/2003 | Okuno et al. |
| 2004/0065919 | A1 * | 4/2004 | Wilson et al. ................. 257/329 |
| 2004/0094783 | A1 * | 5/2004 | Hong ............................ 257/290 |
| 2005/0001248 | A1 * | 1/2005 | Rhodes ......................... 257/292 |
| 2005/0073007 | A1 | 4/2005 | Chen et al. |
| 2006/0081836 | A1 | 4/2006 | Kimura et al. |
| 2007/0164443 | A1 * | 7/2007 | Florian et al. ................. 257/774 |
| 2009/0085101 | A1 | 4/2009 | Huang et al. |
| 2010/0032758 | A1 | 2/2010 | Wang et al. |
| 2012/0112277 | A1 * | 5/2012 | Denison et al. ............... 257/337 |

OTHER PUBLICATIONS

I. Bertrand et al., "New lateral DMOS and IGBT structures realized on a partial SOI substrate based on LEGO process," IEEE BCTM 5.2 Conference Publication, pp. 74-77 (2005).

(Continued)

*Primary Examiner* — Davienne Monbleau
*Assistant Examiner* — Shaka White
(74) *Attorney, Agent, or Firm* — Ingrassia Fisher & Lorenz, P.C.

(57) ABSTRACT

Semiconductor device structures and related fabrication methods are provided. An exemplary method of fabricating a semiconductor device on a doped region of semiconductor material having a first conductivity type involves forming a first region having a second conductivity type within the doped region, forming a body region having the first conductivity type overlying the first region, and forming a drift region having the second conductivity type within the doped region, wherein at least a portion of the drift region abuts at least a portion of the first region. In one embodiment, the dopant concentration of the first region is less than the dopant concentration of the body region and different from the dopant concentration of the drift region.

17 Claims, 5 Drawing Sheets

(56) References Cited

OTHER PUBLICATIONS

Remy Charavel et al., "N-Sinker formation by Phosphorous Silicon Glass Diffusion," 14th annual conference, ON Semiconductor Technical Paper, pp. 1-5 (2011).

USPTO, Office Action for U.S. Appl. No. 13/606,438, mailed Oct. 9, 2013.

Adrian W. Ludikhuize, "A Review of RESURF Technology", the 12th International Symposium on Power Semiconductor Devices and ICs (ISPSD'2000), Copyright 2000 by the IEEE, Catalog No. 00CH37094C.

Piet Wessels, "Power Devices on SOI," MIGAS, Jun. 22, 2009.

Hongning Yang et al., Semiconductor Device and Related Fabrication Methods, U.S. Appl. No. 13/606,438, Filed Sep. 7, 2012.

USPTO, Notice of Allowance and Fee(s) Due for U.S. Appl. No. 13/606,438, mailed Feb. 7, 2014.

\* cited by examiner

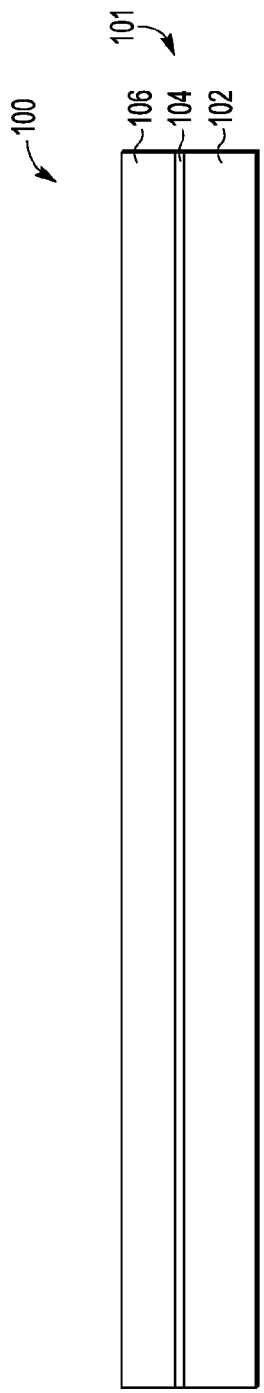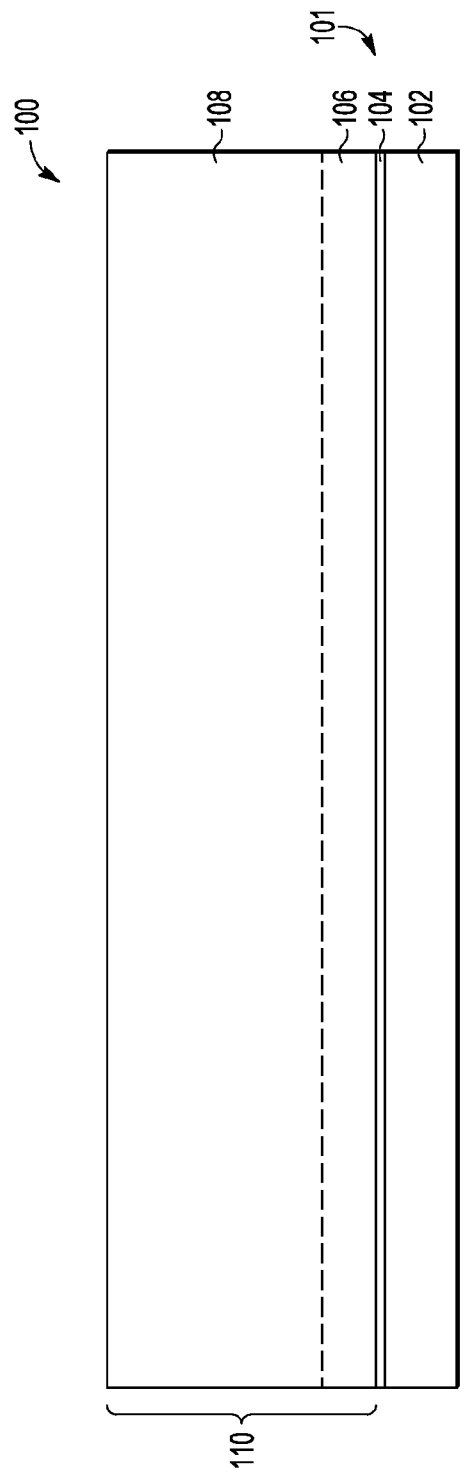

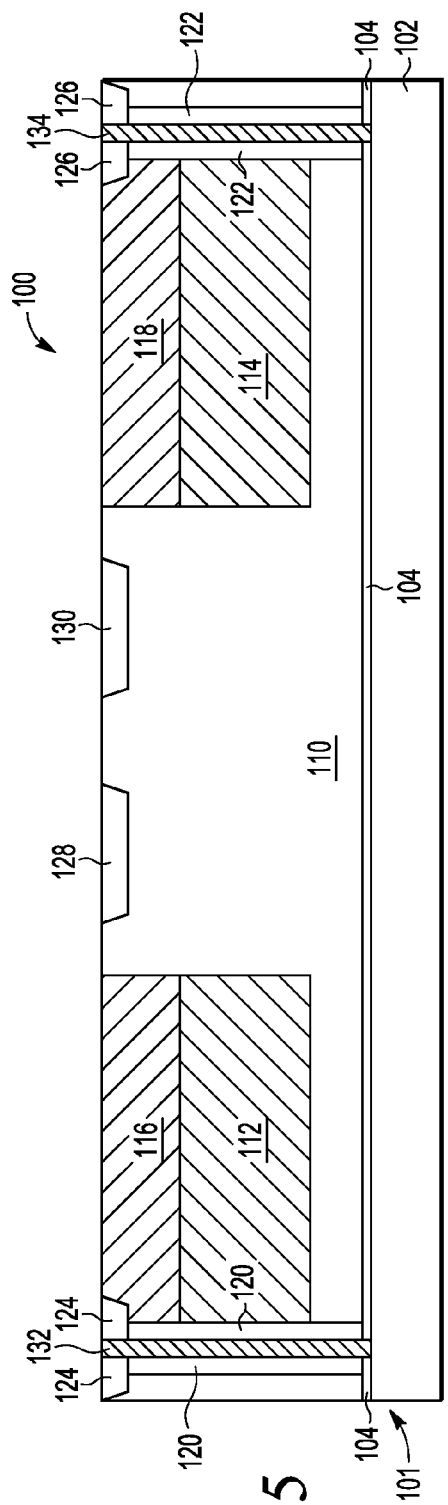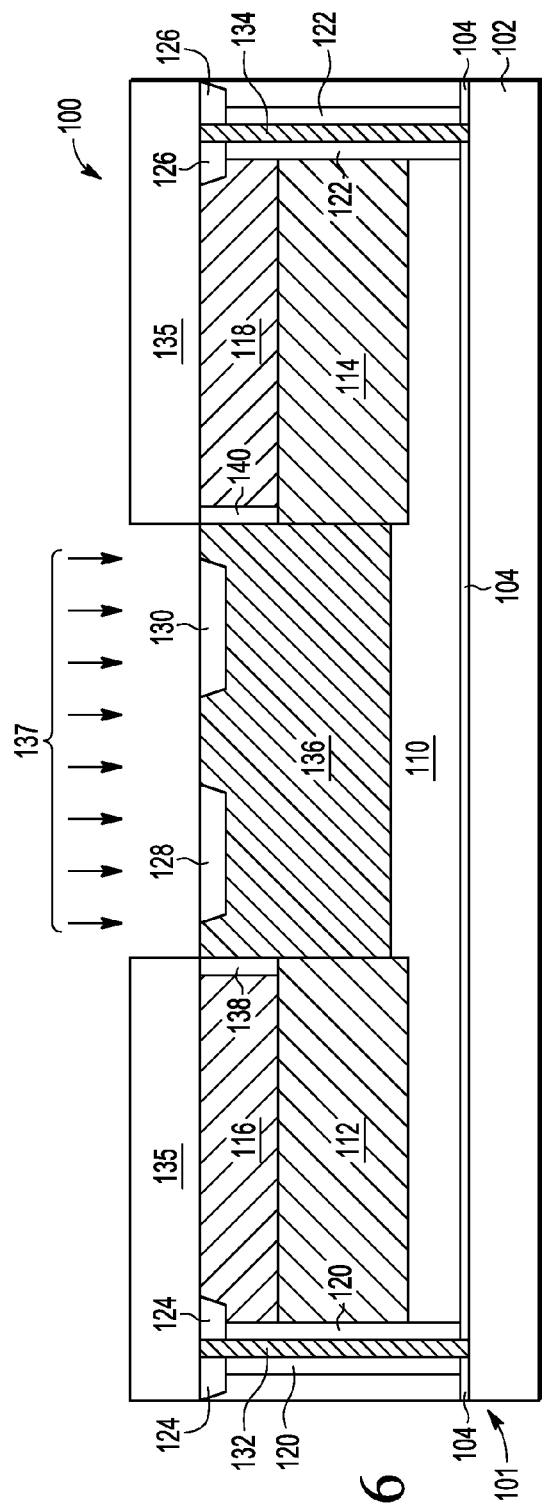

US 9,070,576 B2

SEMICONDUCTOR DEVICE AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased breakdown voltage.

BACKGROUND

During normal operation, the voltage applied to a semiconductor device is constrained by the breakdown voltage of the device, which is the minimum applied voltage that causes avalanche breakdown in the device. For example, the rated drain-to-source voltage of transistor devices is typically set to a value that is well below the drain-to-source voltage that causes avalanche breakdown in the device to provide sufficient margin that accommodates manufacturing variations and/or transient voltage fluctuations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIGS. 1-10 illustrate, in cross section, a semiconductor device structure and exemplary methods for fabricating the semiconductor device in accordance with one embodiment of the invention.

DETAILED DESCRIPTION

Figure 3:
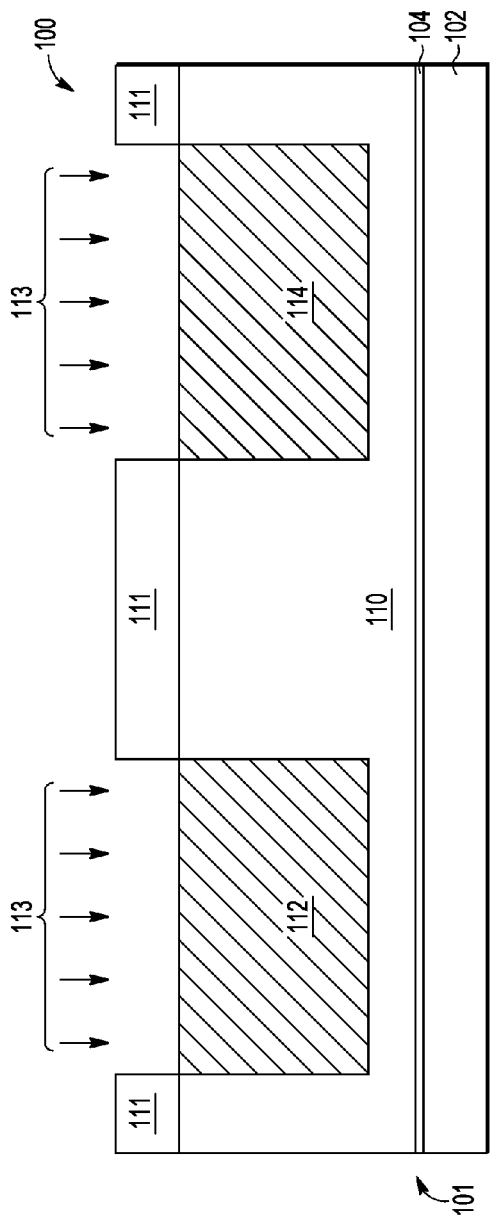

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

In practice, efforts to decrease transistor size and/or minimize on-resistance may lower the breakdown voltage, and thereby, reduce the margin (or voltage difference) between the rated drain-to-source voltage and the breakdown voltage. Thus, it is desirable to increase the breakdown voltage of transistor devices while decreasing transistor size and/or minimizing on-resistance in order to accommodate a higher rated drain-to-source voltage or otherwise increase the margin to relax design windows and/or manufacturing requirements. Accordingly, embodiments of the subject matter described below distribute the drain voltage vertically to increase or otherwise improve the drain-to-source breakdown voltage.

FIGS. 1-10 illustrate, in cross-section, methods for fabricating a semiconductor device structure 100 in accordance with exemplary embodiments. In the illustrated embodiment, the semiconductor device structure 100 is a laterally diffused metal oxide semiconductor (LDMOS) field-effect transistor that includes a doped region that is buried or otherwise underlies the body region to improve vertical distribution of the drain voltage and thereby increase the drain-to-source breakdown voltage, as described in greater detail below. Although "MOS" properly refers to a device having a metal gate electrode and an oxide gate insulator, the subject matter may be utilized with any semiconductor device that includes a conductive gate electrode (whether metal or other conductive material) that is positioned with respect to a gate insulator (whether oxide or other insulator) which, in turn, is positioned with respect to a semiconductor substrate to implement a field-effect transistor, and the subject matter is not intended to be limited to a metal gate electrode and an oxide gate insulator. Furthermore, it should be appreciated that although the subject matter may be described herein in the context of an N-type (or N-channel) device, the subject matter is not intended to be limited to N-type devices and may be implemented in an equivalent manner for a P-type (or P-channel) device (e.g., by interchanging the conductivities of the doped regions). Various steps in the manufacture of MOS devices are well known and so, in the interest of brevity, many conventional steps will only be mentioned briefly herein or will be omitted entirely without providing the well-known process details.

As described in greater detail below, the buried doped region underlies the body region and abuts the lateral drift region to establish an electrical connection with the drain electrode to distribute the drain voltage underneath the body region. As used herein, a "drift region" should be understood as referring to a doped region of semiconductor material between a relatively higher doped drain region (or drain electrode contact region) and a channel region of a transistor device that supports the voltage bias at the drain region by distributing or otherwise dissipating the voltage (or electrical potential) of the drain region throughout the drift region while also providing a conductive path for current between the channel region and the drain region. In exemplary embodiments, the LDMOS transistor structure is fabricated on a silicon-on-insulator (SOI) substrate that includes a doped region having the same conductivity as the body region that overlies an insulating layer and underlies the buried region and the lateral drift region to provide a reduced surface field (RESURF) device. As described below, the insulating layer provides a capacitance capable of distributing the drain voltage vertically, wherein the buried region reduces the percentage of the drain voltage that is laterally distributed by the lateral drift region and increases the percentage of the drain voltage that is vertically distributed by the capacitance provided by the insulating layer, thereby increasing the drain-to-source breakdown voltage of the LDMOS transistor device. Although the subject matter is described herein in the context of forming the LDMOS transistor in epitaxial silicon, the subject matter is not limited to epitaxial silicon and an equivalent LDMOS transistor structure may be fabricated on bulk semiconductor material or other non-epitaxial semiconductor material in an appropriate manner.

Referring now to FIG. 1, in exemplary embodiments, fabrication of the semiconductor device structure 100 begins by providing or otherwise obtaining a SOI substrate 101 having a support (or handle) layer 102 of semiconductor material, an insulating layer 104 of dielectric material on or otherwise overlying the support layer 102, and a layer 106 of semiconductor material on or otherwise overlying the insulating layer 104. As described in greater detail below, in exemplary embodiments, the layer 106 of semiconductor material is utilized to epitaxially grow additional semiconductor material for subsequently fabricating one or more transistor devices thereon, and accordingly, for convenience, but without limitation, the layer 106 of semiconductor material may alternatively be referred to herein as the seed layer. In an exemplary embodiment, the semiconductor material of each of the layers 102, 106 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 102, 106 may be realized as germanium, gallium arsenide, and the like, and/or one or more of the layers 102, 106 may include layers of different semiconductor materials. In accordance with one embodiment, the insulating layer 104 is realized as an oxide layer formed in a subsurface region of the semiconductor substrate 101, also known as a buried oxide (BOX) layer. For example, the buried oxide layer 104 may be formed by oxidizing a wafer of semiconductor material (e.g., seed layer 106) which is then bonded to the support layer 102 to provide the buried layer 104 of oxide material between the support layer 102 and the seed layer 106. In exemplary embodiments, the support layer 102 and the seed layer 106 are each lightly doped. For example, for an N-type device, the seed layer 106 may be realized as a P-type silicon material having a P-type dopant concentration (e.g., boron ions or a boron ionized species) in the range of about $1 \times 10^{13}/cm^3$ to about $1 \times 10^{17}/cm^3$. Similarly, the support layer 102 may also be doped with the same (or different) conductivity-determining impurity type as the seed layer 106. It should be understood that the fabrication process described herein is not constrained by the substrate of semiconductor material utilized, and the fabrication process described herein may also be used to create devices from a bulk semiconductor substrate.

In accordance with one or more embodiments, the fabrication process continues by forming or otherwise providing an epitaxial layer 108 of semiconductor material on the seed layer 106 to provide an active region 110 of semiconductor material having a desired thickness and conductivity, resulting in the semiconductor device structure 100 illustrated in FIG. 2. In accordance with one or more embodiments, for an N-type device, the epitaxial layer 108 is formed by epitaxially growing silicon material on the seed layer 106 and in-situ doping the silicon material by adding boron ions (or other P-type ions) to the reactants used to epitaxially grow the layer 108. In one or more embodiments, for an N-type device, the epitaxial layer 108 has a P-type dopant concentration (e.g., boron ions or a boron ionized species) in the range of about $1 \times 10^{13}/cm^3$ to about $1 \times 10^{16}/cm^3$. In an exemplary embodiment, the epitaxial layer 108 is grown to a thickness such that a total thickness of the active region 110 (e.g., the sum of the thickness of the seed layer 106 and the epitaxial layer 108) is in the range of about one micron (or micrometers) to about 10 microns, which may vary depending on the needs of a particular application. For convenience and ease of explanation, the seed layer 106 and the epitaxial layer 108 may collectively be referred to herein as the active region 110 of substrate semiconductor material.

Referring now to FIG. 3, in exemplary embodiments, the fabrication process continues by forming doped regions 112, 114 of semiconductor material within the active region 110 that have a conductivity type that is opposite the conductivity of the active region 110 and a dopant concentration that is greater than the dopant concentration of the active region 110. As described in greater detail below, each of the regions 112, 114 function as a vertical drain voltage enhancement region that reduces the vertical distribution of the drain voltage along the vertical boundary with the subsequently formed body region of the subsequently formed transistor structure, that is, the vertical p-n junction between the drain and body, and thereby increases the break down voltage at the boundary. In an exemplary embodiment, the enhancement regions 112, 114 are formed by masking the semiconductor device structure 100 with an implantation mask 111 that is patterned to expose the underlying regions of the active region 110 to be used for the subsequently formed body regions. The enhancement regions 112, 114 are then formed by implanting ions of the conductivity-determining impurity type opposite the conductivity of the active region 110, illustrated by arrows 113, in the active region 110 with a dopant concentration in the range of about $1 \times 10^{15}/cm^3$ to about $5 \times 10^{16}/cm^3$ at an energy level of in the range of about 1 megaelectron volt (MeV) to about 2 MeV to provide the enhancement regions 112, 114 having a depth (after subsequent thermal annealing and any other diffusion) that is greater than the depth of body regions subsequently formed in the enhancement regions 112, 114 but less than the thickness of the active region 110. For example, in accordance with one embodiment, for an N-channel semiconductor device, enhancement regions 112, 114 are formed by implanting N-type ions, such as phosphorous ions or a phosphorous ionized species, with a dopant concentration of about $1 \times 10^{16}/cm^3$ and an energy level of about 2 MeV to provide enhancement regions 112, 114 having a depth in the range of about 3 microns to about 4 microns relative to the surface of the active region 110.

Figure 4:
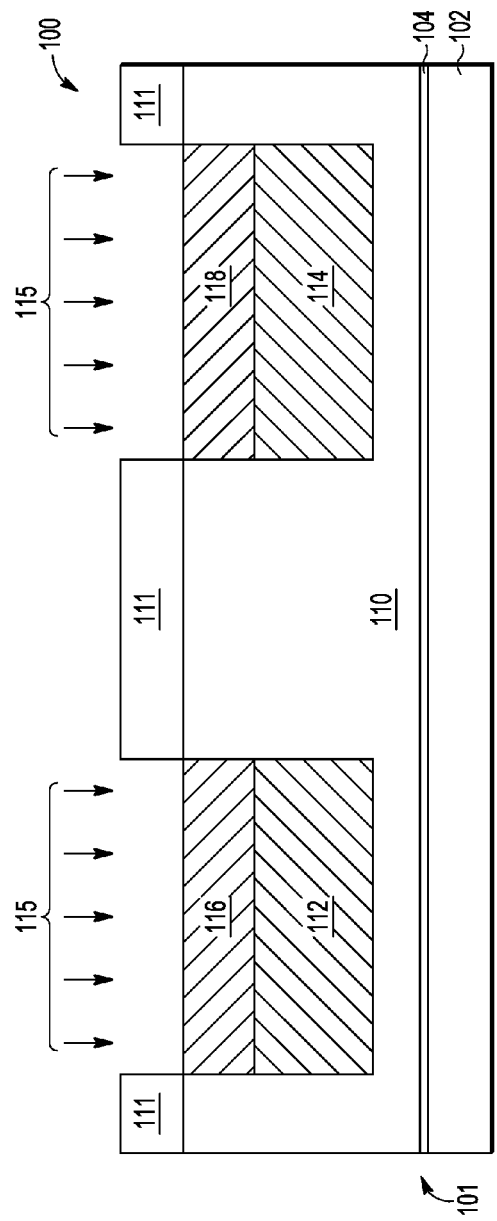

Referring to FIG. 4, in exemplary embodiments, the fabrication process continues by forming doped regions 116, 118 of semiconductor material within the enhancement regions 112, 114 that have a conductivity type that is opposite the conductivity of the enhancement regions 112, 114. As described in greater detail below, each of the regions 116, 118 function as a part of the body region of the subsequently formed LDMOS transistor device, and accordingly, the regions 116, 118 may alternatively be referred to herein as body regions. In an exemplary embodiment, the body regions 116, 118 are formed using the same implantation mask 111 that was used for the enhancement regions 112, 114. The body regions 116, 118 are formed by implanting ions of the opposite conductivity-determining impurity type, illustrated by arrows 115, in the enhancement regions 112, 114 with a dopant concentration in the range of about $5 \times 10^{16}/cm^3$ to about $1 \times 10^{18}/cm^3$ at an energy level in the range of about 20 kiloelectron volts (keV) to about 300 keV to provide the body regions 116, 118 having a depth (after subsequent thermal annealing and any other diffusion) that is less than the depth of the enhancement regions 112, 114. For example, in accordance with one embodiment, for an N-channel semiconductor device, body regions 116, 118 are formed by implanting P-type ions, such as boron ions or a boron ionized species, with a dopant concentration of about $1 \times 10^{17}/cm^3$ in a series of one or more implants having energy levels in the range of about 20 keV to about 300 keV to provide body regions 116, 118 having a depth in the range of about 1 micron to about 1.5 microns relative to the surface of the active region 110. In this regard, the dopant concentration of the body regions 116, 118 may be greater than the dopant concentration of the enhancement regions 112, 114 with the depth (or extent of diffusion) of the enhancement regions 112, 114 being greater than the depth (or extent of diffusion) of the body regions 116, 118 by virtue of the higher energy level used for the enhancement region implants. In this manner, each respective body region 116, 118 overlies a portion of a respective enhancement region 112, 114 with the lower boundary of a respective body region 116, 118 being adjacent to or otherwise abutting the upper boundary of the underlying portion of a respective enhancement region 112, 114. Thus, the enhancement regions 112, 114 are spaced apart or otherwise separated from the upper surface of the active region 110 by the body regions 116, 118, that is, the enhancement regions 112, 114 are buried beneath the body regions 116, 118.

Referring now to FIG. 5, in an exemplary embodiment, after performing the ion implantation process steps to form the enhancement regions 112, 114 and body regions 116, 118, the fabrication process continues by removing the implantation mask 111 and forming isolation regions in the active region 110 of semiconductor material. In an exemplary embodiment, the fabrication process isolates the transistor device subsequently formed on the active region 110 from adjacent semiconductor devices by performing deep trench isolation (DTI) to provide deep isolation regions 120, 122 of dielectric material. For example, to form deep isolation region 120, 122, the portions of the active region 110 to be utilized for the transistor device may be masked, and the mask may then be patterned to expose portions of the active region 110 which are then etched until the buried layer 104 is exposed, and a dielectric material, such as an oxide material, may be deposited to fill the trenches or grown on the exposed surfaces of the trenches, resulting in deep isolation regions 120, 122. After forming deep isolation regions 120, 122, the fabrication process continues by forming shallow isolation regions 124, 126, 128, 130 of a dielectric material by performing shallow trench isolation (STI). To form the shallow isolation regions 124, 126, 128, 130, the portions of the active region 110 to be utilized for the electrode regions of the transistor device are masked, and the mask is patterned to expose portions of the body regions 116, 118 and the deep isolation regions 120, 122 which are then etched to a depth that is less than the depth (or thickness) of the body regions 116, 118, and a dielectric material, such as an oxide material, may be deposited to fill the trenches, resulting in shallow isolation regions 124, 126, 128, 130.

In the illustrated embodiment, after forming the shallow isolation regions 124, 126, 128, 130, the fabrication process continues by forming conductive (or semiconductive) contacts 132, 134 to the support layer 102 via the deep isolation regions 120, 122. To form the conductive contacts 132, 134, the portions of the active region 110 to be utilized for the transistor device are masked, and the mask is patterned to expose interior portions of the isolation regions 120, 122, 124, 126 then etched to a depth that is greater than or equal to the depth (or thickness) of the active region 110 and the buried layer 104 to expose the support layer, and a conductive (or semiconductive) material, such as a polysilicon material, may be deposited to fill the trenches, resulting in conductive contacts 132, 134. The conductive contacts 132, 134 may be utilized to bias the support layer 102 to a desired electrical potential (e.g., electrical ground), as described in greater detail below.

Turning now to FIG. 6, in an exemplary embodiment, after forming the isolation regions and support layer contacts, the fabrication process continues by forming a doped region 136 of semiconductor material within the active region 110 having the same conductivity of the enhancement regions 112, 114. As described in greater detail below, the region 136 functions as a lateral drift region between the drain electrode and the conductive channel of the subsequently formed transistor structure, and accordingly, the region 136 may alternatively be referred to herein as the lateral drift region. In the illustrated embodiment, the lateral drift region 136 is formed by masking the body regions 116, 118 of the semiconductor device structure 100 with an implantation mask 135 that is patterned to expose the interior portion of the active region 110 between the body regions 116, 118. The lateral drift region 136 is then formed by implanting ions of the same conductivity-determining impurity type as the enhancement regions 112, 114, illustrated by arrows 137, in the active region 110 with a dopant concentration in the range of about $1 \times 10^{15}/cm^3$ to about $5 \times 10^{16}/cm^3$ at an energy level greater than the energy level used for the body regions 116, 118 to provide the lateral drift region 136 having a depth that is greater than the depth of the body regions 116, 118. For example, in accordance with one embodiment, for an N-channel semiconductor device, the lateral drift region 136 is formed by implanting N-type ions, such as phosphorous ions or a phosphorous ionized species, with a dopant concentration of about $2 \times 10^{16}/cm^3$ in a series of one or more implants having energy levels in the range of about 50 keV to about 1000 keV to provide the lateral drift region 136 having a depth in the range of about 2 microns to about 3 microns relative to the surface of the active region 110. In this regard, an upper portion of the lateral drift region 136 is vertically aligned with the body regions 116, 118 but a lower portion of the lateral drift region 136 extends deeper than the lower boundaries of the body regions 116, 118. By virtue of the relatively high implant energy level used for the enhancement regions 112, 114 in conjunction with the affinity of doped regions for other regions having the same conductivity type, the portions of the enhancement regions 112, 114 that diffuse vertically beneath the body regions 112, 114 may diffuse laterally so that the lower portion of the lateral drift region 136 abuts or otherwise contacts the laterally-extending portions of the adjacent enhancement regions 112, 114 (e.g., the portions of the enhancement regions 112, 114 that do not underlie the body regions 116, 118 after diffusion) to provide an electrical connection (or conductive path) to/from that respective enhancement region 112, 114. In one or more embodiments, the ion implantation energy level used to form the lateral drift region 136 may be less than or equal to the ion implantation energy level used to form the enhancement regions 112, 114 so that the distance between the lower boundaries of the enhancement regions 112, 114 and the buried layer 104 is less than the distance between the lower boundary of the lateral drift region 136 and the buried layer 104, as illustrated in FIG. 6. In other words, the thickness of the remaining P-type portions of the active region 110 between the enhancement regions 112, 114 and the buried layer 104 is less than the thickness of the remaining P-type portions of the active region 110 between the lateral drift region 136 and the buried layer 104.

Still referring to FIG. 6, in exemplary embodiments, the lateral edges of the implantation mask 135 are offset from the lateral boundaries of the body regions 116, 118 so that portions 138, 140 of the active region 110 adjacent to the lateral boundaries of the body region 116, 118 are not doped during the ion implantation process to form the lateral drift region 136 while still providing portions of the lateral drift region 136 between a respective isolation region 128, 130 and those portions 138, 140 of the active region 110. Thus, for an N-type device, a lightly doped P-type region 138, 140 overlies a portion of a respective N-type enhancement region 112, 114 and resides laterally between the N-type lateral drift region 136 and its relatively higher doped adjacent P-type body region 116, 118, and at least a portion of the N-type lateral drift region 136 resides laterally between a respective P-type region 138, 140 and a respective isolation region 128, 130. By virtue of the lightly doped regions 138, 140 between the body regions 116, 118 and the lateral drift region 136, a reduced electrical field at the p-n junction is achieved, thereby improving the breakdown voltage. The relatively lighter doped portions 138, 140 of the active region 110 between the lateral drift region 136 and the body regions 116, 118 may alternatively be referred to herein as lightly doped body regions or a lightly doped portion of the body.

Figure 7:
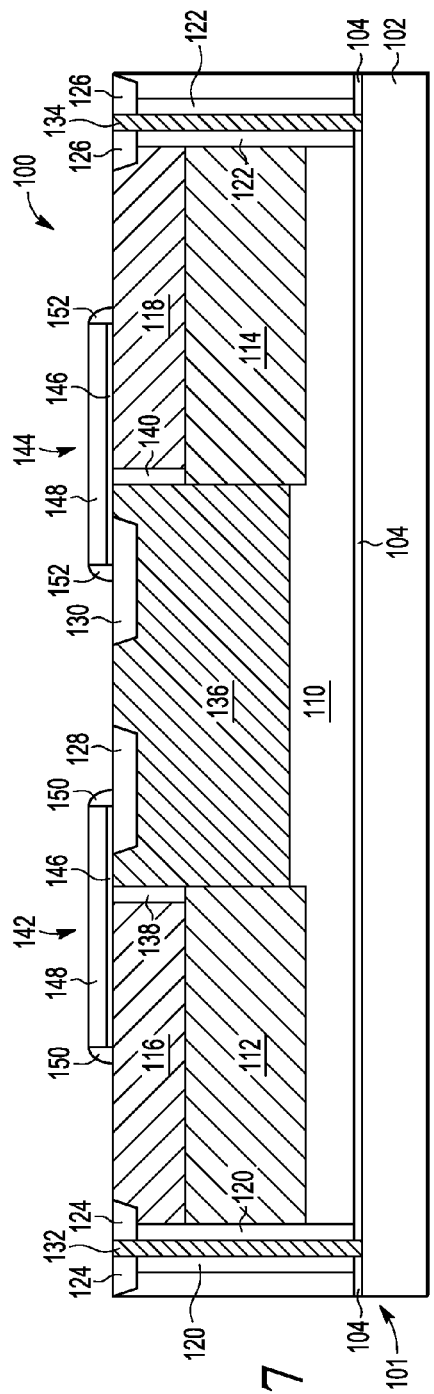

Turning now to FIG. 7, after forming the lateral drift region 136, the fabrication process continues by removing the implantation mask 135 and fabricating a plurality of gate structures 142, 144 overlying the active region 110, wherein the gate structures 142, 144 each include a flap portion that overlaps or otherwise overlies at least a portion of respective isolation region 128, 130. As illustrated, the first gate structure 142 overlies at least a portion of the isolation region 128, the lightly doped body region 138, the portion of the drift region 136 disposed between the isolation region 128 and the lightly doped body region 138, and the portion of the body region 116 adjacent to the lightly doped body region 138. Similarly, the second gate structure 144 overlies at least a portion of the isolation region 130, the lightly doped body region 140, the portion of the drift region 136 disposed between the isolation region 130 and the lightly doped body region 140, and the portion of the body region 118 adjacent to the lightly doped body region 140. In exemplary embodiments, the first gate structure 142 and the second gate structure 144 are electrically connected so that they have the same electrical potential and collectively function as the conductive gate electrode for the subsequently formed LDMOS transistor structure. By virtue of the flap portions of the gate structures 142, 144 overlying the isolation regions 128, 130 formed in the lateral drift region 136, the upper surfaces of the isolation regions 128, 130 are biased to the gate voltage.

In exemplary embodiments, the gate structures 142, 144 are formed by forming one or more layers of dielectric material 146 overlying the semiconductor device structure 100, forming one or more layers of conductive (or semiconductive) material 148 overlying the dielectric material 146, and etching the layers of materials 146, 148 to define the gate structures 142, 144. In this regard, the conductive material 148 functions as the conductive gate electrode material of the gate electrode structure 142 and the underlying portion of dielectric material 146 functions as the gate insulator. In accordance with one or more embodiments, the dielectric material 146 is realized as an oxide material, such as silicon dioxide, that is grown or otherwise formed by oxidizing the exposed surfaces of the active region 110, for example, by performing thermal oxidation by exposing the device structure 100 to an oxidizing ambient at an elevated temperature to promote selective growth of oxide material on the exposed surfaces of the active region 110 to a thickness of about 7 nanometers (nm) to about 35 nm. After the dielectric material 146 is formed, the conductive material 148 may be formed by conformably depositing a conductive material, such as a polycrystalline silicon material, by chemical vapor deposition (CVD) or another suitable deposition process to a thickness of about 100 nm to about 350 nm. After the conductive material 148 is formed, fabrication of the gate structures 142, 144 may be completed by masking the portions of the materials 146, 148 to be utilized for the gate structures 142, 144 and etching the exposed portions of materials 146, 148 using an anisotropic etchant. In the illustrated embodiment, sidewall spacers 150, 152 are formed about the sidewalls of the gate structures 142, 144 in a conventional manner, for example, by conformably depositing a layer of nitride material overlying the semiconductor device structure 100 and anisotropically etching the nitride material to remove the nitride material on top of the gate structures 142, 144.

Figure 8:
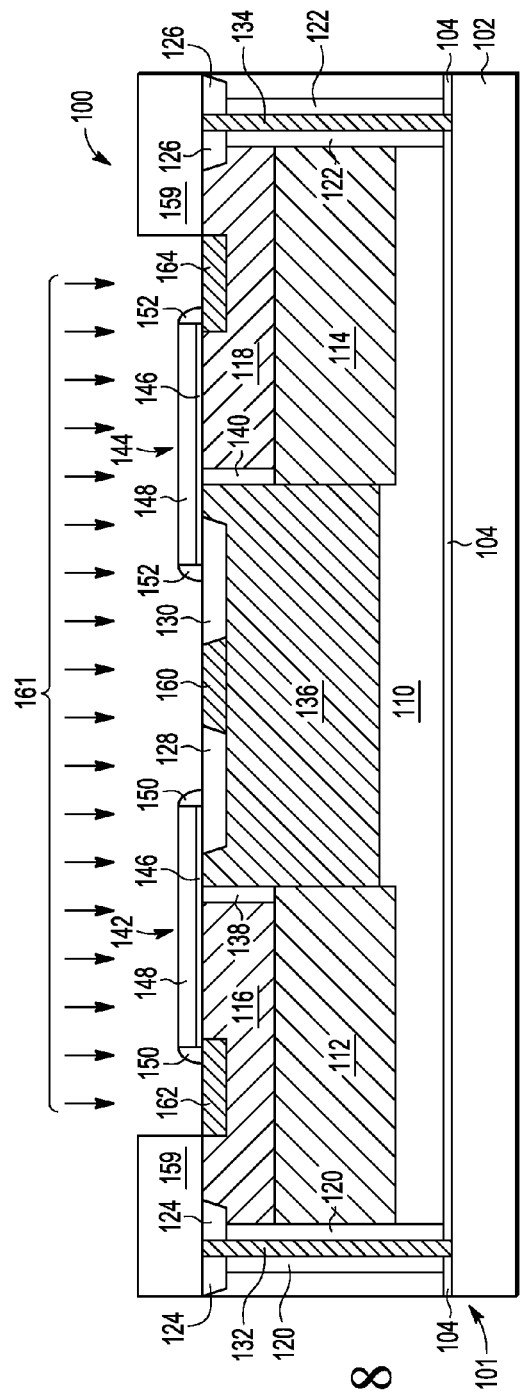
Figure 9:
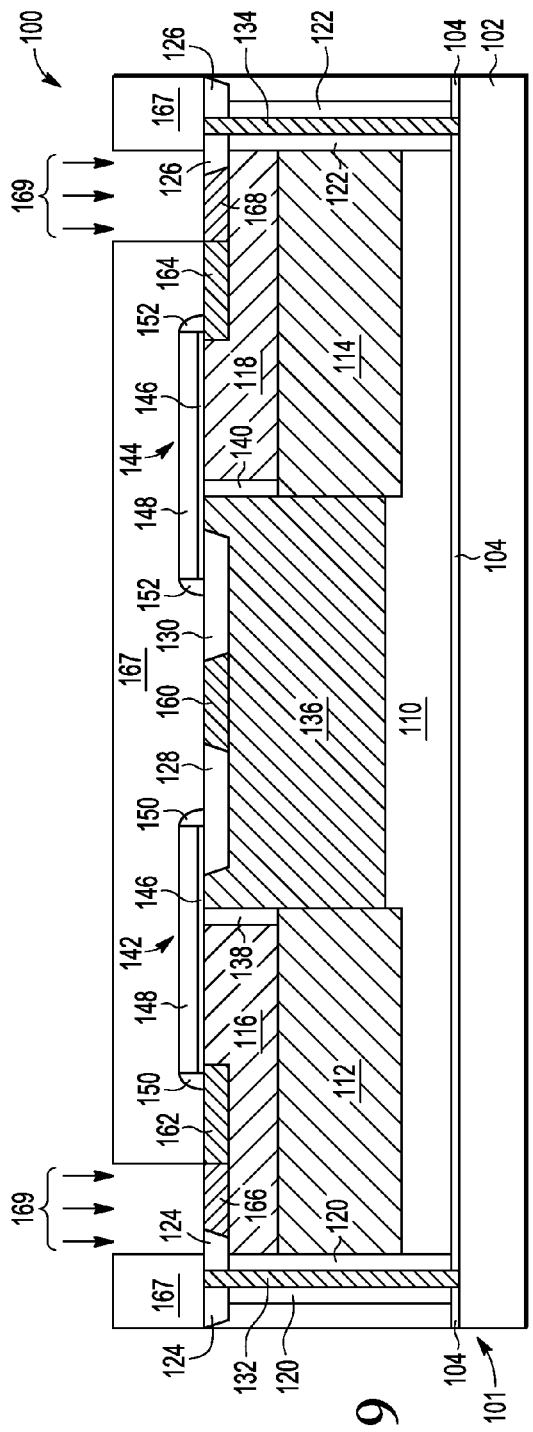

Turning now to FIGS. 8-9, after forming gate structures 142, 144, fabrication of the semiconductor device structure 100 continues by forming doped electrode contact regions 160, 162, 164, 166, 168 for subsequently forming electrical connections between the semiconductor device structure and external circuitry. In this regard, the contact regions 160, 162, 164, 166, 168 are relatively heavily doped such that they have low resistivity. As illustrated in FIG. 8, in an exemplary embodiment, a drain contact region 160 is formed in the lateral drift region 136 and source contact regions 162, 164 are formed in the body regions 116, 118 proximate the gate electrode structures 142, 144 by masking the semiconductor device structure 100 with an implantation mask 159 that masks portions of the body regions 116, 118 proximate the isolation regions 124, 126 and leaves exposed the remaining portions of the active region 110 to be used for the drain/source contact regions 160, 162, 164. Additionally, the implantation mask 159 may also be patterned to expose the gate structures 142, 144 so that the gate structures 142, 144 are concurrently doped during the ion implantation step used to form the drain/source contact regions 160, 162, 164. It should be noted that in alternative embodiments, the drain/source contact regions 160, 162, 164 may be formed with separate ion implantations steps and/or differing dopant concentrations. For example, laterally diffused source extension regions may be formed to extend further underneath the gate structures 142, 144 prior to forming the source regions 162, 164.

In exemplary embodiments, the drain/source contact regions 160, 162, 164 are formed by implanting ions of the same conductivity-determining impurity type as the lateral drift region 136, illustrated by arrows 161, in the exposed portions of the lateral drift region 136 and body regions 116, 118 using the implantation mask 159 resulting in the semiconductor device structure 100 of FIG. 8. For example, in accordance with one embodiment, for an N-channel semiconductor device, the drain/source contact regions 160, 162, 164 are formed by implanting N-type ions, such as phosphorous ions or a phosphorous ionized species, with a dopant concentration in the range of about $1 \times 10^{19}/cm^3$ to about $1 \times 10^{21}/cm^3$ at an energy level of about 30 keV. In this regard, the ion implantation energy level used for the drain/source contact regions 160, 162, 164 is less than the ion implantation energy level used for the body regions 116, 118 such that the depth of the source regions 162, 164 is less than the depth of the body regions 116, 118 and the depth of the drain region 160 is less than the depth of the isolation regions 128, 130. For example, in one embodiment, phosphorous ions or a phosphorous ionized species are implanted with a dopant concentration of about $1 \times 10^{21}/cm^3$ at an energy level of about 30 keV to provide drain/source contact regions 160, 162, 164 having a depth of about 100 nm relative to the surface of the active region 110. It will be appreciated that the source contact regions 162, 164 function as the source (or source region) for the subsequently formed transistor structure, whereas the drain (or drain region) for the subsequently formed transistor structure includes the drain contact region 160 and the lateral drift region 136. As described above, the enhancement regions 112, 114 are electrically connected to the lateral drift region 136 and raise the voltage (or electrical potential) at the lower boundaries of the body regions 116, 118, and also raise the voltage of the underlying active region 110 near the buried layer 104 across the device structure 100, thereby reducing the vertical electrical field distribution along the p-n junction formed between the drift region 136 and the body regions 116, 118, 138, 140 and increasing the vertical breakdown voltage.

Turning now to FIG. 9, in the illustrated embodiment, after forming the drain/source contact regions 160, 162, 164, the fabrication process continues by removing the implantation mask 159 and forming body contact regions 166, 168 in the body regions 116, 118 between a respective source contact region 162, 164 and a respective isolation region 124, 126. In this regard, the semiconductor device structure 100 is masked with an implantation mask 167 that masks the gate structures 142, 144 and the drain/source contact regions 160, 162, 164 and leaves exposed the remaining portions of the body regions 116, 118. The body contact regions 166, 168 are formed by implanting ions of the same conductivity-determining impurity type as the body regions 116, 118, illustrated by arrows 169, in the exposed portions of the body regions 116, 118 using the implantation mask 167, resulting in the semiconductor device structure 100 of FIG. 9. For example, in accordance with one embodiment, for an N-channel semiconductor device, the body contact regions 166, 168 are formed by implanting P-type ions, such as boron ions or a boron ionized species, with a dopant concentration in the range of about $1 \times 10^{19}/cm^3$ to about $1 \times 10^{21}/cm^3$ at an energy level in the range of about 2 keV to about 6 keV. In this regard, the dopant concentration of the body contact regions 166, 168 is greater than the dopant concentration of the body regions 116, 118 but the ion implantation energy level used for the body contact regions 166, 168 is less than the ion implantation energy level used for the body regions 116, 118 such that the depth of the body contact regions 166, 168 is less than the depth of the body regions 116, 118. For example, in one embodiment, boron ions or a boron ionized species are implanted with a dopant concentration of about $1 \times 10^{21}/cm^3$ at an energy level of about 5 keV to provide contact regions 166, 168 having a depth of about 100 nm relative to the surface of the active region 110. In this regard, the depth and dopant concentration of the body contact regions 166, 168 may be substantially same as the depth and dopant concentration of the drain/source contact regions 160, 162, 164 but having opposite conductivity.

Figure 10:
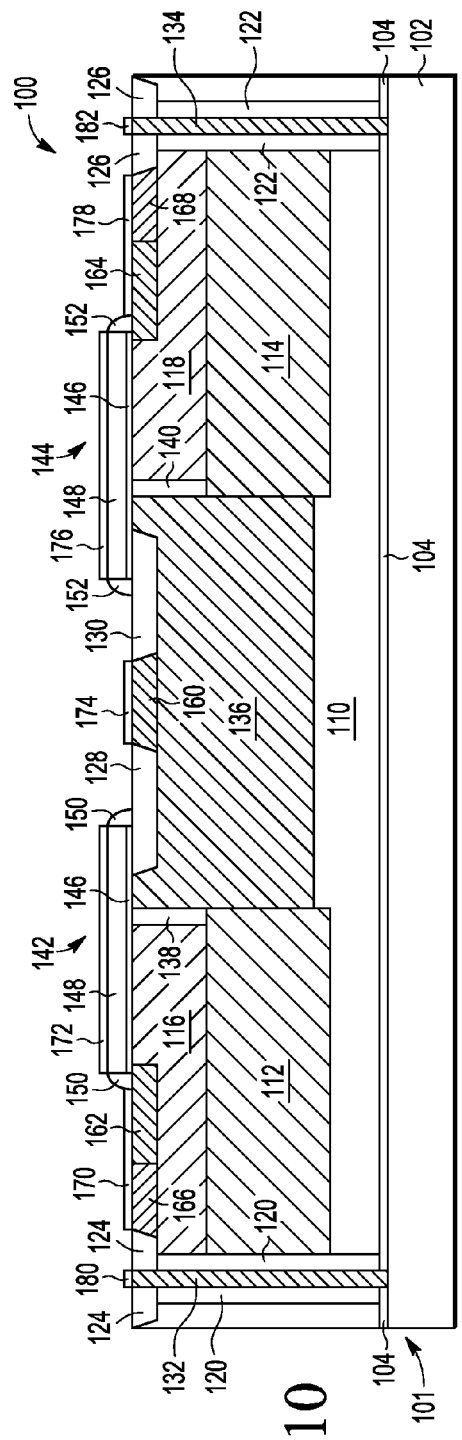

Turning now to FIG. 10, in the illustrated embodiment, after the electrode contact regions 160, 162, 164, 166, 168 are formed, fabrication of the transistor device continues by removing the implantation mask 167 and forming contacts 170, 172, 174, 176, 178, overlying the contact regions 160, 162, 164, 166, 168 and the gate structures 142, 144. In an exemplary embodiment, the contacts 170, 172, 174, 176, 178 are realized as a metal silicide layer formed by conformably depositing a layer of silicide-forming metal onto the exposed surfaces of the contact regions 160, 162, 164, 166, 168 and the gate structures 142, 144 and heating the device structure 100, for example by rapid thermal annealing (RTA), to react the silicide-forming metal with the exposed silicon and form the metal silicide layer 170, 172, 174, 176, 178 at the top of the respective contact region 160, 162, 164, 166, 168 or gate structure 142, 144. Any silicide-forming metal that is not in contact with exposed silicon, such as, for example, the silicide-forming metal that is deposited on the isolation regions 124, 126, 128, 130 and sidewall spacers 150, 152, does not react during the RTA to form a silicide and may subsequently be removed in a conventional manner. In this regard, contacts 180, 182 may also be concurrently formed overlying the conductive polysilicon contacts 132, 134 to the support layer 102.

In accordance with one or more embodiments, after forming silicide contacts, fabrication of the transistor device continues by forming appropriate electrical interfaces and/or electrical connections to/from the silicide contacts, for example, using subsequently formed interconnect layers overlying the semiconductor device structure 100. For example, the gate structures 142, 144 may be electrically connected, for example, by providing a conductive connection between the gate contacts 172, 176 so that the gate structures 142, 144 have the same voltage (or electrical potential). As illustrated in FIG. 10, in exemplary embodiments, each source contact region 162, 164 is electrically connected (or shorted) to its adjacent body contact region 166, 168 by its respective overlying contact 170, 178, such that the underlying body regions 116, 118 are biased to the source voltage. The source regions 162, 164 may be electrically connected, for example, by providing a conductive connection between the source contacts 170, 178 so that the body regions 116, 118 have the same voltage (or electrical potential). In exemplary embodiments, the support layer 102 is biased to a ground voltage, for example, by connecting or otherwise providing the ground voltage to the contacts 180, 182. In some embodiments, the source voltage may be the ground voltage, in which case the support layer contacts 180, 182 and the source contacts 170, 178 are electrically connected or otherwise shorted together to bias the support layer 102 to the source voltage.

As described above, the enhancement regions 112, 114 are electrically connected to the lateral drift region 136 to increase the voltage (or electrical potential) along the lower boundaries of the body regions 116, 118 and also increase the voltage of the underlying active region 110. As a result, the distribution of the drain voltage along the vertical boundaries of the body regions 116, 118 is reduced and the voltage across the buried layer 104 is increased, thereby increasing the percentage of the drain voltage that is vertically distributed or otherwise supported by the capacitance provided by the buried layer 104. By virtue of the vertical electrical field distribution throughout the p-n junction between drain and body being reduced, the vertical breakdown voltage of the LDMOS transistor device is increased.

It should be noted that in some embodiments, the semiconductor device structure 100 may be rectangular, square, or circular in shape or otherwise formed so that the regions depicted as being separate in the cross-sections of FIGS. 1-10 may be integral or otherwise continuous, as will be appreciated in the art. For example, the drift region 136, drain region 160 and drain contact 174 may be located substantially at the center of the semiconductor device structure 100 with the remaining regions of the semiconductor device structure 100 being disposed about the drain, such that the enhancement regions 112, 114 are integral, the body regions 116, 118 are integral, the gate structures 142, 144 are integral, and so on.

For the sake of brevity, conventional techniques related to semiconductor and/or integrated circuit fabrication, power transistors, biasing, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

In an exemplary embodiment, a method is provided for fabricating a semiconductor device on a doped region of semiconductor material having a first conductivity type. The method comprises forming a first region having a second conductivity type within the doped region, forming a body region having the first conductivity type overlying the first region, and forming a drift region having the second conductivity type within the doped region, wherein at least a portion of the drift region abuts at least a portion of the first region. In one embodiment, forming the first region comprises implanting ions of the second conductivity type having a first dopant concentration using an implantation mask and forming the body region comprises implanting ions of the first conductivity type having a second dopant concentration using the implantation mask, wherein the second dopant concentration is greater than the first dopant concentration. In a further embodiment, forming the drift region comprises implanting ions of the second conductivity type having a third dopant concentration using a second implantation mask and the third dopant concentration different from the first dopant concentration. In another embodiment, forming the first region comprises implanting ions of the second conductivity type having the first dopant concentration at a first energy level and forming the body region comprises implanting ions of the first conductivity type having the second dopant concentration at a second energy level, wherein the second energy level is less than the first energy level. In a further embodiment, forming the drift region comprises implanting ions of the second conductivity type having a third dopant concentration at a third energy level using a second implantation mask, wherein the third energy level is less than the first energy level. In yet another embodiment, forming the first region comprises implanting ions of the second conductivity type at a first energy level using an implantation mask and forming the body region comprises implanting ions of the first conductivity type at a second energy level using the implantation mask, wherein the second energy level is less than the first energy level. In a further embodiment, implanting ions of the second conductivity type at the first energy level comprises implanting the ions of the second conductivity type at an energy level greater than or equal to 1 megaelectron volt and implanting ions of the first conductivity type at the second energy level comprises implanting the ions of the first conductivity type at an energy level less than or equal to 300 kiloelectron volts. In another embodiment, forming the drift region comprises implanting ions of the second conductivity type at a third energy level using a second implantation mask and the third energy level is greater than the second energy level. In yet another embodiment, forming the drift region comprises implanting ions of the second conductivity type using a second implantation mask, wherein the second implantation mask masks the body region and has lateral edges offset from lateral boundaries of the body region such that a portion of the doped region remains between the body region and the drift region. In accordance with yet another embodiment, the method further comprises forming an isolation region of dielectric material within the doped region, forming a drain contact region within the drift region, the drain contact region having the second conductivity type, wherein the isolation region is laterally between the drain contact region and the body region, forming a gate structure overlying at least a portion of the body region, a portion of the drift region laterally between the isolation region and the portion of the body region, and at least a portion of the isolation region, and forming a source contact region within the body region proximate the gate structure. In a further embodiment, the method comprises epitaxially growing at least a portion of the doped region on a semiconductor substrate, the semiconductor substrate comprising an isolation layer of dielectric material overlying a handle layer of semiconductor material.

In another exemplary embodiment, a method of fabricating a semiconductor device on a semiconductor substrate, the semiconductor substrate comprising a doped region of semiconductor material having a first conductivity type overlying a layer of dielectric material is provided. The method comprises forming a first region of semiconductor material having a second conductivity type within the doped region, the first region having a first dopant concentration, forming a second region of semiconductor material having the first conductivity type overlying the first region, the second region having a second dopant concentration that is greater than the first dopant concentration, and forming a third region of semiconductor material having the second conductivity type within the doped region, the third region having a third dopant concentration that is less than the second dopant concentration, wherein the third region abuts the first region. In one embodiment, the doped region comprises a first P-type region of semiconductor material, wherein forming the first region comprises implanting N-type ions having the first dopant concentration at a first energy level using an implantation mask, forming the second region comprises implanting P-type ions having the second dopant concentration at a second energy level using the implantation mask, the second energy level being less than the first energy level, and forming the third region comprises implanting N-type ions having the third dopant concentration at a third energy level using a second implantation mask, the third energy level being greater than the second energy level and less than the first energy level.

In yet another embodiment, an apparatus for a semiconductor device structure is provided. The semiconductor device structure comprises a drift region of semiconductor material having a first conductivity type, a body region of semiconductor material having a second conductivity type, and a buried region of semiconductor material having the first conductivity type, wherein the body region overlies a first portion the buried region and a lower portion of the drift region abuts at least a second portion of the buried region. In one embodiment, a dopant concentration of the buried region is different from a dopant concentration of the drift region. In another embodiment, a dopant concentration of the body region is greater than the dopant concentration of the buried region. In yet another embodiment, a lower boundary of the buried region extends below a lower boundary of the drift region. In accordance with another embodiment, the semiconductor device structure further comprises a drain region of semiconductor material within the drift region, the drain region having the first conductivity type, and an isolation region of dielectric material laterally between the drain region and the body region. In accordance with yet another embodiment, the semiconductor device structure further comprises a first region of semiconductor material having the second conductivity type and an insulating layer of dielectric material, wherein the buried region and the drift region overlie the first region and the first region overlies the insulating layer. In one embodiment, a distance between a lower boundary of the drift region and the insulating layer is greater than a distance between a lower boundary of the buried region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A method of fabricating a semiconductor device on a doped region of semiconductor material having a first conductivity type, the doped region overlying an insulating layer of dielectric material, the method comprising:
   forming a first region having a second conductivity type within the doped region by implanting ions of the second conductivity type at a first energy level using an implantation mask;
   forming a body region having the first conductivity type overlying the first region by implanting ions of the first conductivity type at a second energy level using the implantation mask, the second energy level being less than the first energy level; and
   forming a drift region having the second conductivity type within the doped region by implanting ions of the second conductivity type using a second implantation mask, the second implantation mask masking the body region and having lateral edges offset from lateral boundaries of the body region, wherein:
      at least a portion of the drift region abuts at least a portion of the first region;
      a first thickness of a first portion of the doped region between the first region and the insulating layer is less than a second thickness of a second portion of the doped region between the drift region and the insulating layer; and
      a portion of the doped region remains between the body region and the drift region.

2. The method of claim 1, wherein:
   forming the first region comprises implanting ions of the second conductivity type having a first dopant concentration using the implantation mask;
   forming the body region comprises implanting ions of the first conductivity type having a second dopant concentration using the implantation mask; and
   the second dopant concentration is greater than the first dopant concentration.

3. The method of claim 2, wherein:
   forming the drift region comprises implanting ions of the second conductivity type having a third dopant concentration using the second implantation mask; and
   the third dopant concentration different from the first dopant concentration.

4. The method of claim 2, wherein:
   forming the first region comprises implanting ions of the second conductivity type having the first dopant concentration at a first energy level;
   forming the body region comprises implanting ions of the first conductivity type having the second dopant concentration at a second energy level; and
   the second energy level is less than the first energy level.

5. The method of claim 4, wherein:
   forming the drift region comprises implanting ions of the second conductivity type having a third dopant concentration at a third energy level using a second implantation mask; and
   the third energy level is less than the first energy level.

6. The method of claim 1, wherein:
   implanting ions of the second conductivity type at the first energy level comprises implanting the ions of the second conductivity type at an energy level greater than or equal to 1 megaelectron volt; and
   implanting ions of the first conductivity type at the second energy level comprises implanting the ions of the first conductivity type at an energy level less than or equal to 300 kiloelectron volts.

7. The method of claim 1, wherein:
   forming the drift region comprises implanting ions of the second conductivity type at a third energy level using the second implantation mask; and
   the third energy level is greater than the second energy level.

8. A method of fabricating a semiconductor device on a doped region of semiconductor material having a first conductivity type, the method comprising:
   forming a first region having a second conductivity type within the doped region by implanting ions of the second conductivity type at a first energy level using an implantation mask;
   forming a body region having the first conductivity type overlying the first region by implanting ions of the first conductivity type at a second energy level using the implantation mask, wherein the second energy level is less than the first energy level; and
   forming a drift region having the second conductivity type within the doped region, by implanting ions of the second conductivity type using a second implantation mask, the second implantation mask masking the body region and having lateral edges offset from lateral boundaries of the body region, wherein:
      a portion of the doped region remains between the body region and the drift region; and
      at least a portion of the drift region abuts at least a portion of the first region.

9. The method of claim 1, further comprising:
   forming an isolation region of dielectric material within the doped region;
   forming a drain contact region within the drift region, the drain contact region having the second conductivity type, wherein the isolation region is between the drain contact region and the body region;
   forming a gate structure overlying at least a portion of the body region, a portion of the drift region between the isolation region and the portion of the body region, and at least a portion of the isolation region; and
   forming a source contact region within the body region proximate the gate structure.

10. The method of claim 9, further comprising epitaxially growing at least a portion of the doped region on a semiconductor substrate, the semiconductor substrate comprising the insulating layer overlying a handle layer of semiconductor material.

11. A semiconductor device structure comprising:
    a drift region of semiconductor material having a first conductivity type;
    a drain region of semiconductor material within the drift region, the drain region having the first conductivity type;
    a body region of semiconductor material having a second conductivity type;
    a buried region of semiconductor material having the first conductivity type;
    a doped region of semiconductor material having the second conductivity type; and
    an insulating layer of dielectric material, wherein:
       a first portion of the doped region overlies the insulating layer between the buried region and the insulating layer;
       a second portion of the doped region overlies the insulating layer between the drift region and the insulating layer;

the body region overlies a first portion the buried region;
a lower portion of the drift region abuts at least a second portion of the buried region; and
the drift region is formed using an implantation mask masking the body region and having lateral edges offset from lateral boundaries of the body region such that a third portion of the doped region remains between the body region and the drift region.

12. The semiconductor device structure of claim 11, wherein a dopant concentration of the buried region is different from a dopant concentration of the drift region.

13. The semiconductor device structure of claim 12, wherein a dopant concentration of the body region is greater than the dopant concentration of the buried region.

14. The semiconductor device structure of claim 11, wherein a lower boundary of the buried region extends below a lower boundary of the drift region.

15. The semiconductor device structure of claim 11, further comprising:
an isolation region of dielectric material between the drain region and the body region.

16. The semiconductor device structure of claim 11, wherein a distance between a lower boundary of the drift region and the insulating layer is greater than a distance between a lower boundary of the buried region and the insulating layer.

17. The semiconductor device structure of claim 11, wherein a thickness of the first portion of the doped region is less than a thickness of the second portion of the doped region.

* * * * *